(12) United States Patent
Tani

(10) Patent No.: US 7,687,348 B2
(45) Date of Patent: Mar. 30, 2010

(54) SEMICONDUCTOR DEVICE AND METHOD OF PRODUCING THE SAME

(75) Inventor: Kouichi Tani, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 296 days.

(21) Appl. No.: 11/798,302

(22) Filed: May 11, 2007

(65) Prior Publication Data

US 2008/0067591 A1 Mar. 20, 2008

(30) Foreign Application Priority Data

Sep. 14, 2006 (JP) .............................. 2006-249669

(51) Int. Cl.
*H01L 21/336* (2006.01)
*H01L 27/01* (2006.01)

(52) U.S. Cl. ...................................... 438/262; 257/349

(58) Field of Classification Search ......... 257/347–350, 257/E29.287, 398–401; 438/262, 294
See application file for complete search history.

(56) References Cited

U.S. PATENT DOCUMENTS

2003/0071308 A1* 4/2003 Yoshida ...................... 257/348

2004/0031996 A1* 2/2004 Brian Li et al. ............. 257/408

FOREIGN PATENT DOCUMENTS

JP 2003-124345 4/2003

* cited by examiner

*Primary Examiner*—Calvin Lee
(74) *Attorney, Agent, or Firm*—Kubotera & Associates, LLC

(57) ABSTRACT

A semiconductor device includes a semiconductor substrate having an insulation layer and a semiconductor layer formed on the insulation layer; a channel area formed in the semiconductor layer; a gate electrode formed on the channel area; a source area formed in the semiconductor layer and having a depth not reaching the insulation layer; a drain area formed in the semiconductor layer adjacent to the source area with the channel area in between and having a depth reaching the insulation layer; a separation area disposed next to the source area opposite to the channel area and having a depth not reaching the insulation layer; a high-concentration body area formed in the semiconductor layer at lease in a surface layer thereof and between the first separation area and the second separation area; and a body contact disposed on the high-concentration body area.

13 Claims, 7 Drawing Sheets

SEMICONDUCTOR DEVICE AND METHOD OF PRODUCING THE SAME

BACKGROUND OF THE INVENTION AND RELATED ART STATEMENT

The present invention relates to a semiconductor device and a method of producing the semiconductor device. In particular, the present invention relates to a semiconductor device having a body contact for pulling out hot carrier generated in a channel area, and a method of producing the semiconductor device.

A conventional semiconductor substrate having a silicon layer on a wafer with insulation property includes a silicon on insulator (SOI) substrate, a silicon on sapphire (SOS) substrate, and the likes.

In the SOI substrate, a buried oxide layer (refer to as a BOX layer) is formed in a single crystal silicon substrate. That is, the SOI substrate has a three-layered structure formed of the silicon substrate, the BOX layer formed on an upper surface of the silicon substrate, and a silicon layer formed on an upper surface of the BOX layer. In the SOS substrate, a silicon layer is formed on a sapphire wafer through epitaxial growth.

In the SOI substrate, the BOX layer is formed in the silicon layer as an insulation layer to electrically separate individual element areas formed in an element forming area. In the SOS substrate, an element separation area is formed in the silicon layer with a depth reaching to the sapphire wafer to electrically separate individual element areas formed in an element forming area.

In these cases, each of the element areas has a side surface and a backside surface covered with the element separation area and the silicon layer. Accordingly, in the SOI substrate and the SOS substrate, it is possible to separate the element areas more securely as compared with a semiconductor substrate without an insulation layer. As a result, when a transistor is formed in the element area of the SOI substrate or the SOS substrate, it is possible to reduce an influence of other transistors. That is, with the SOI substrate or the SOS substrate, it is possible to produce a transistor with high tolerance against crosstalk noises without causing latch up.

As described above, in the semiconductor substrate such as the SOI substrate and the SOS substrate, individual transistors formed thereon are completely insulated with each other. Accordingly, when hot carrier is generated in a channel area (body area), hot carrier tends to accumulate in an area around a source area. When hot carrier accumulates in an area around the source area, it is known that a parasitic bipolar effect would occur, thereby causing a fluctuation in transistor characteristics such as decrease in a threshold voltage, increase in a current between source and drain, and the likes.

In order to suppress the parasitic bipolar effect, a conventional semiconductor device is adopted to have a body-tie structure or a source-tie structure.

FIG. 6 is a schematic plan view showing a conventional semiconductor device having the body-tie structure. In the conventional semiconductor device having the body-tie structure, a conductive type impurity similar to that of a channel area 103 is introduced at a high concentration in an area called a high-concentration body area 105.

The high-concentration body area 105 is arranged adjacent to end portions of the channel area 103 and first and second main electrode areas 107a and 107b sandwiching the channel area 103. The high-concentration body area 105 is formed of an expansion portion extending from the channel area 103 in a channel width direction.

In the conventional semiconductor device having the body-tie structure, a contact or body contact 109 is formed on the high-concentration body area 105 away from the channel area 103 and the first and second main electrode areas 107a and 107b for applying a potential to the high-concentration body area 105. With this structure, hot carrier generated in the channel area 103 moves to the high-concentration body area 105, and is pulled out through the body contact 109.

FIG. 7 is a schematic plan view showing a conventional semiconductor device having the source-tie structure. In the conventional semiconductor device having the source-tie structure, a high-concentration body area 115 is formed in an element area 111. The high-concentration body area 115 is arranged in an area next to a source area, i.e., a first main electrode area 113a or a second main electrode area 113b functioning as the source area, opposite to a channel area 117. In the structure shown in FIG. 7, the first main electrode area 113a is provided as the source area.

In the conventional semiconductor device having the source-tie structure, a hot carrier moving area 119 is provided as an expansion area extending from the channel area 117 in a channel width direction. A conductive type impurity similar to that of the high-concentration body area 115 and the channel area 117 is introduced into the hot carrier moving area 119.

In the conventional semiconductor device having the source-tie structure, similar to the conventional semiconductor device having the body-tie structure, a body contact 121 is disposed away from the source area 113a for applying a potential to the high-concentration body area 115. With this structure, hot carrier generated in the channel area 117 moves to the high-concentration body area 115 through the hot carrier moving area 119, and is pulled out through the body contact 112.

As described above, in the conventional semiconductor device having the body-tie structure and the conventional semiconductor device having the source-tie structure, in addition to the channel area 103 or 117, and the first and second main electrode areas 107a and 107b or 113a and 113b as the source and drain areas constituting an ordinal transistor, it is necessary to provide the high-concentration body area 105 or 115 and the hot carrier moving area 119.

Further, in order to suppress an influence of the high-concentration body area 105 or 115 and the hot carrier moving area 119 on the transistor, it is necessary to electrically separate the high-concentration body area 105 or 115 and the hot carrier moving area 119 from the channel area 103 or 117 and the first and second main electrode areas 107a and 107b or 113a and 113b. That is, for the electrical separation, it is necessary to provide a separation gate electrode portion 127 or 129 in addition to a channel control gate electrode portion 123 or 125.

In particular, in the conventional semiconductor device having the body-tie structure, the separation gate electrode portion 127 is provided on the high-concentration body area 105 in a length over the first main electrode area 107a, the channel area 103, and the second main electrode area 107b. In the conventional semiconductor device having the source-tie structure, the separation gate electrode portion 127 is provided on the hot carrier moving area 119 in a length over the high-concentration body area 115, the first main electrode area 113a, the channel area 117, and the second main electrode area 113b.

Accordingly, while an ordinal gate electrode portion has an I character shape, the separation gate electrode portion 127 or 129 has a T character shape. As a result, as opposed to an ordinal transistor, an area of one single element area increases, thereby making it difficult to reduce a size of the element and produce a highly integrated device.

Further, in the conventional semiconductor device having the body-tie structure and the conventional semiconductor device having the source-tie structure, it is necessary to provide the separation gate electrode portions 127 and 129, thereby increasing a gate area. Accordingly, a gate resistance tends to increase, and a shielding frequency tends to deteriorate.

Patent Reference has disclosed a semiconductor device having a minimized element area. In the semiconductor device disclosed in Patent Reference, first and second main electrode areas as a source area and a drain area are formed in a silicon layer, and have a depth not reaching a BOX layer. A high-concentration body area is formed in an area opposite to a channel area of the first or second main electrode area. A conductive type impurity similar to that of the channel area is introduced into the high-concentration body area at a high concentration.

In the semiconductor device disclosed in Patent Reference, the high-concentration body area is insulated from the first and second main electrode areas with an oxide layer (first separation area) formed with a well-known local oxidation of silicon (LOCOS) method. A second separation area is provided between chips or elements for insulating the chips or elements. Different from the second separation area, the first separation area has a depth not reaching the BOX layer. Further, a body contact is formed on the high-concentration body area for pulling out hot carrier.

As described above, in the semiconductor device disclosed in Patent Reference, the first and second main electrode areas and the first separation area are formed in the silicon layer and have depths not reaching the BOX layer. Accordingly, hot carrier may be able to move from the channel area to the high-concentration body area through an area (lower area) in the silicon layer between the first or second main electrode area and the first separation area, and the BOX layer.

Accordingly, when a potential is applied to the high-concentration body area through the body contact, hot carrier generated in the channel area moves to the high-concentration body area through the lower area of the first or second main electrode area and the first separation area in the silicon layer. After moving to the high-concentration body area, hot carrier is pulled out through the body contact.

Accordingly, in the semiconductor device disclosed in Patent Reference, it is not necessary to provide the hot carrier moving area as in the conventional semiconductor device. Further, it is not necessary to provide the separation gate electrode portion in addition to an ordinal gate electrode portion. Accordingly, it is possible to minimize the element area. Further, it is possible to prevent a gate resistance from increasing due to an enlarged gate area and a shielding frequency from deteriorating.

Patent Reference: Japanese Patent Application No. 2003-124345

As described above, in the semiconductor device disclosed in Patent Reference, the first and second main electrode areas as the source area and the drain area have depths not reaching the BOX layer. Accordingly, a contact area between the channel area and the drain area increases, so that a contact capacity increases when the transistor is driven. As a result, the semiconductor device disclosed in Patent Reference is not suitable for a high-speed operation.

Further, in the semiconductor device disclosed in Patent Reference, when the transistor is driven, a depletion layer tends to extend in the lower area of the drain in the silicon layer. Accordingly, when a gate length decreases accompanied with a decrease in a size of the element, a threshold voltage decreases, thereby causing a short channel effect.

When the semiconductor device disclosed in Patent Reference is produced, the first separation area is formed with the LOCOS method, so that the first separation area has a depth not reaching the BOX layer. In this step, it is necessary to form the first separation layer away from the BOX layer, so that hot carrier can move through the lower area of the first separation area. However, it is difficult to accurately adjust a thickness of the oxide layer as the first separation area with the LOCOS method. Accordingly, in the semiconductor device disclosed in Patent Reference, it is difficult to obtain a sufficient distance between the first separation area and the BOX layer in the silicon layer. In an opposite case, the first separation area may reach the BOX layer.

The problem described above becomes apparent when the first separation area is formed in the SOI substrate coated with a thin silicon layer. When a sufficient distance is not obtained between the first separation area and the BOX layer, or the first separation area reaches the BOX layer, hot carrier generated in the channel area cannot move through the lower area of the first separation area. Accordingly, hot carrier thus generated does not move to the high-concentration body area, so that hot carrier cannot be pulled out through the body contact.

In view of the problems described above, an object of the present invention is to provide a semiconductor device using the SOI substrate, the SOS substrate, or a semiconductor substrate having an insulation layer. In the semiconductor device of the present invention, it is possible to minimize the parasitic bipolar effect without increasing an element area. Further, it is possible to reduce the short channel effect. Another object of the present invention is to provide a method of producing the semiconductor device.

Further objects and advantages of the invention will be apparent from the following description of the invention.

SUMMARY OF THE INVENTION

In order to attain the objects described above, according to a first aspect of the present invention, a semiconductor device includes a semiconductor substrate having ah insulation layer and a semiconductor layer of a first conductive type formed on the insulation layer. The semiconductor layer includes an element area. The element area is defined with a second separation area having a depth from a surface of the semiconductor layer reaching the insulation layer.

According to the first aspect of the present invention, the element area is provided with a channel area. A gate electrode is formed on the channel area. Further, the element area is provided with a source area and a drain area with the channel area inbetween. The channel area, the gate electrode, the source area, and the drain area constitute a metal-oxide-semiconductor field effect transistor (MOSFET). The source area has a depth from a surface of the element area not reaching the insulation layer. The drain area has a depth from the surface of the element area reaching the insulation layer.

According to the first aspect of the present invention, the semiconductor device further includes a first separation area disposed next to a side edge of the source area opposite to the channel area. The first separation area has a depth from the surface of the element area not reaching the insulation layer.

According to the first aspect of the present invention, the semiconductor device further includes a high-concentration body area formed at lease in a surface layer thereof between the first separation area and the second separation area. A conductive impurity same as that of the channel area is introduced into the high-concentration body area. The high-concentration body area is connected to the channel area in the semiconductor layer through a lower area of the first separation area and the source area. A body contact is disposed on the high-concentration body area.

According to a second aspect of the present invention, a method of producing a semiconductor device includes the steps from step 1 to step 7.

In step 1, a semiconductor substrate is prepared. The semiconductor substrate includes an insulation layer and a semiconductor layer. A first conductive impurity is introduced into the semiconductor layer.

In step 2, a second separation area is formed in the semiconductor layer for defining an element area. The second separation area has a depth from a surface of the semiconductor layer reaching the insulation layer.

In step 3, a first separation layer is formed in the semiconductor layer with a shallow trench isolation (STI) method. The first separation area has a depth from a surface of an element area not reaching the insulation layer. An intermediate high-concentration body area is provided between the first separation area and the second separation area.

In step 4, the first conductive impurity is introduced into at least a front surface in the intermediate high-concentration body area at a high concentration to convert the intermediate high-concentration body area into a high-concentration body area.

In step 5, a gate electrode is formed on an upper side of the element area opposite to the high-concentration body area relative to the first separation area.

In step 6, a second conductive impurity having polarity opposite to that of the first conductive impurity is introduced into a first area and a second area in the element area at both sides of the gate electrode. As a result, a source area having a depth not reaching the insulation layer is formed in the first area at a side of the first separation area. Further, a drain area having a depth reaching the insulation layer is formed in the second area. Still further, a channel area is formed below the gate electrode between the source area and the drain area. The channel area, the source area, the drain area, and the gate electrode constitute a metal-oxide-semiconductor field effect transistor (MOSFET).

In step 7, a body contact is formed in the high-concentration body area.

As described above, in the semiconductor device in the first aspect, the source area is formed in the semiconductor layer and has a depth not reaching the insulation layer. Further, the first separation area is formed on the side of the source area opposite to the channel area, and has a depth not reaching the insulation layer. Accordingly, since the source area and the first separation area have depths not reaching the insulation layer, the channel area is connected to the high-concentration body area through the lower portions of the source area and the first separation area in the semiconductor layer.

Accordingly, in the semiconductor device in the first aspect, hot carrier generated in the channel area can move to the high-concentration body area through the lower portions of the source area and the first separation area 23 in the semiconductor layer, i.e., the portions between the first separation area and the source area, and the insulation layer. When a potential is applied to the high-concentration body area through the body contact, hot carrier generated in the channel area moves to the high-concentration body area through the lower portions of the source area and the first separation area in the semiconductor layer. After moving to the high-concentration body area, hot carrier is pulled out through the body contact formed on the upper surface of the high-concentration body area.

Further, the high-concentration body area is electrically separated with the first separation area from the area where the MOSFET is formed. Accordingly, in the semiconductor device in the first aspect, it is not necessary to provide a gate electrode portion for separation, thereby reducing an influence of the high-concentration body area on the MOSFET.

As compared with a conventional structure such as a body-tie structure and a source-tie structure, in the semiconductor device in the first aspect, it is not necessary to provide a hot carrier moving area. Further, other than the gate electrode portion, it is not necessary to provide an additional gate electrode portion for separation. Accordingly, it is possible to reduce the area of the element area, thereby preventing an increase in a gate resistance and deterioration of a shielding frequency caused by an increase in a gate area.

In Patent Reference, the first and second main electrode areas have depths not reaching an insulation layer. On the other hand, in the semiconductor device in the first aspect, the drain area is formed in the semiconductor layer and has a depth reaching the insulation layer. Accordingly, a contact area between the drain area and the channel area is small. As a result, as compared with the semiconductor device disclosed in Patent Reference, when the MOSFET is driven, a contact capacity between the channel area 39 and the drain area decreases, thereby making the MOSFET suitable for a high-speed operation.

In the semiconductor device in the first aspect, the drain area is formed in the semiconductor layer and has a depth reaching the insulation layer. Accordingly, there is no portion of the semiconductor layer below the drain area. As a result, as compared with the semiconductor device disclosed in Patent Reference, when the MOSFET is driven, a depletion layer does not expand in the semiconductor layer below the drain area, thereby preventing a short channel effect.

In Patent Reference, a separation area is formed with a local oxidation of silicon (LOCOS) method. In the method of producing the semiconductor device in the first aspect, in the third step, the first separation area is formed with the well-known STI method. In the STI method, as compared with the LOCOS method, it is possible to easily control the thickness of the first separation area. Accordingly, as compared with the method disclosed in Patent Reference, it is possible to securely form the first separation area away from the insulation layer.

Accordingly, in the semiconductor device in the first aspect, it is possible to form the first separation area in the semiconductor layer away from the insulation layer, so that hot carrier can move. That is, it is possible to prevent problems, in which it is difficult to obtain a sufficient distance between the high-concentration body area and the insulation layer, or the first separation area contacts with the insulation layer.

Even when the semiconductor layer formed on a silicon on insulator (SOI) substrate or a silicon on sapphire (SOS) substrate has a small thickness, it is possible to form the first separation area while accurately adjusting a distance between the first separation area and the insulation layer. Accordingly, it is possible to effectively move hot carrier generated in the channel area to the high-concentration body area through the lower portion of the first separation area. Then, hot carrier is securely pulled out through the body contact.

BRIEF DESCRIPTION OF THE DRAWINGS

FIGS. 1(A) to 1(C) are schematic sectional views showing a process of manufacturing a semiconductor device according to an embodiment of the present invention, wherein FIG. 1(C) is a schematic sectional view taken along a line 1(C)-1(C) in FIG. 4;

DETAILED DESCRIPTION OF PREFERRED EMBODIMENTS

Figure 1:
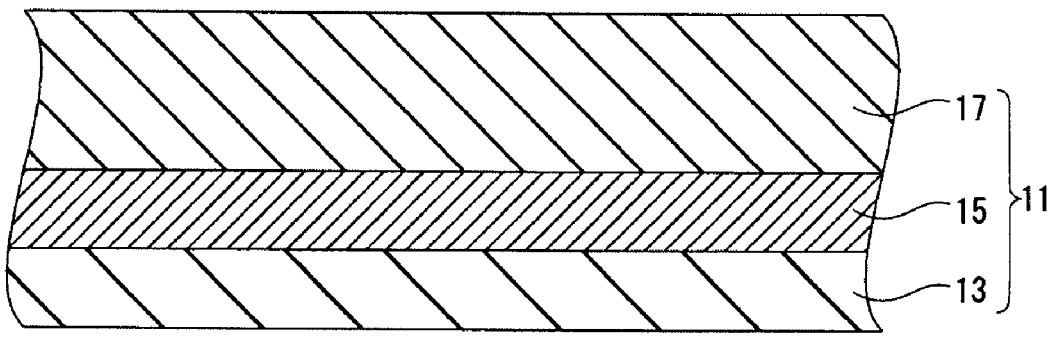
Figure 1:
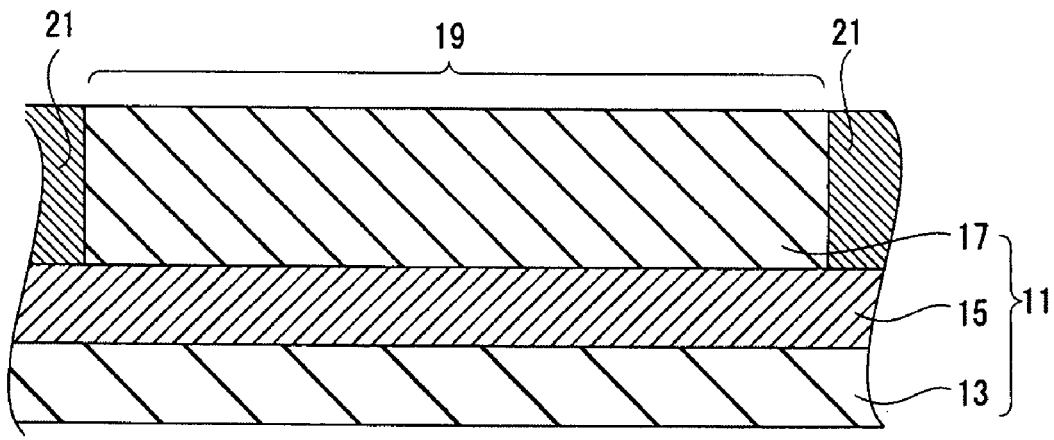
Figure 1:
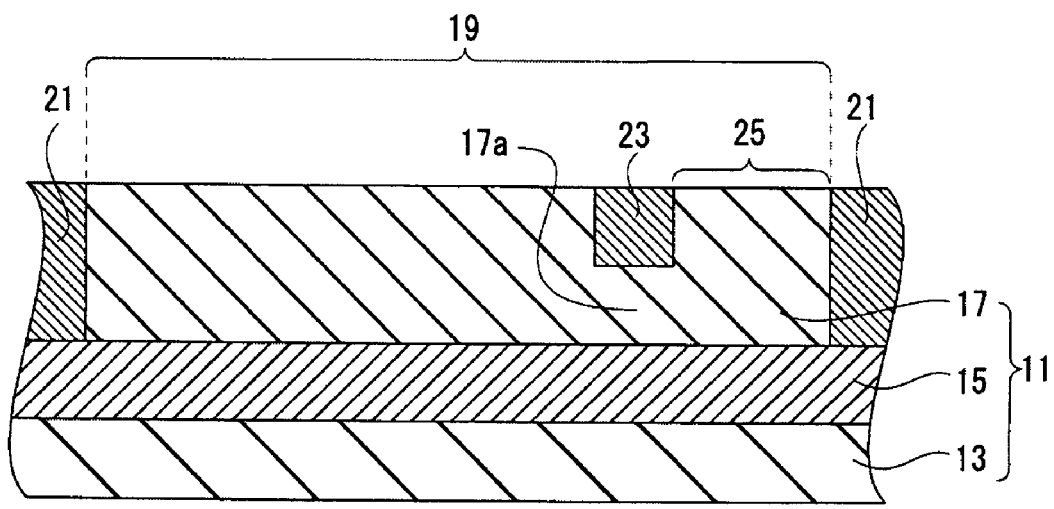

Hereunder, embodiments of the present invention will be explained with reference to the accompanying drawings. In the following description of the present invention, each of the drawings is illustrated schematically in terms of a shape, a size and a dimensional relationship for explaining the embodiments of the present invention, and the present invention is not limited to the shape, the size, and the dimensional relationship shown in the drawings.

In the embodiment, a semiconductor device includes a metal-oxide-semiconductor field effect transistor (MOSFET), and uses a semiconductor substrate having an insulation layer and a semiconductor layer formed on an upper surface of the insulation layer. The semiconductor device further includes a high-concentration body area and a body contact for pulling out hot carrier from a channel area through an area, i.e., a lower area, below a source area and a first separation area in the semiconductor device.

A method of producing the semiconductor will be explained next. The method includes steps from a first step to a seventh step.

Figure 2:
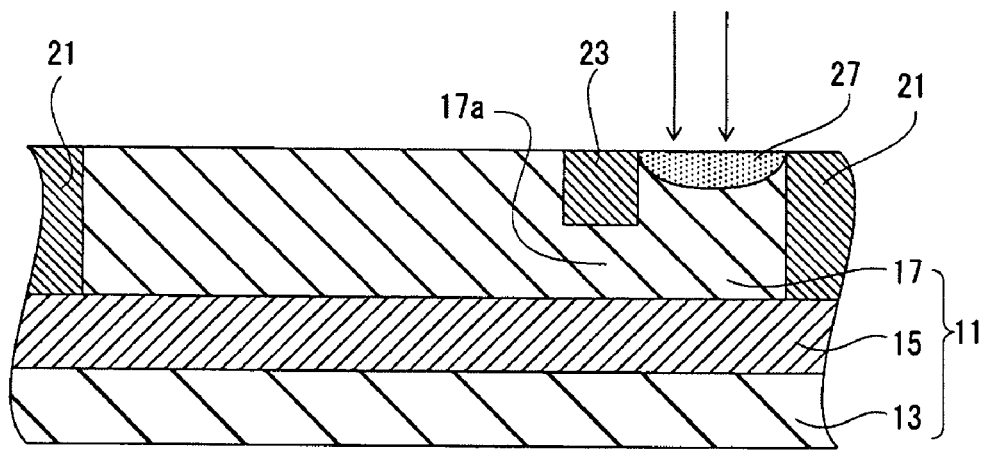
FIGS. 2(A) to 2(C) are schematic sectional views showing the process of manufacturing the semiconductor device continued from FIG. 1(C) according to the embodiment of the present invention.
Figure 2:
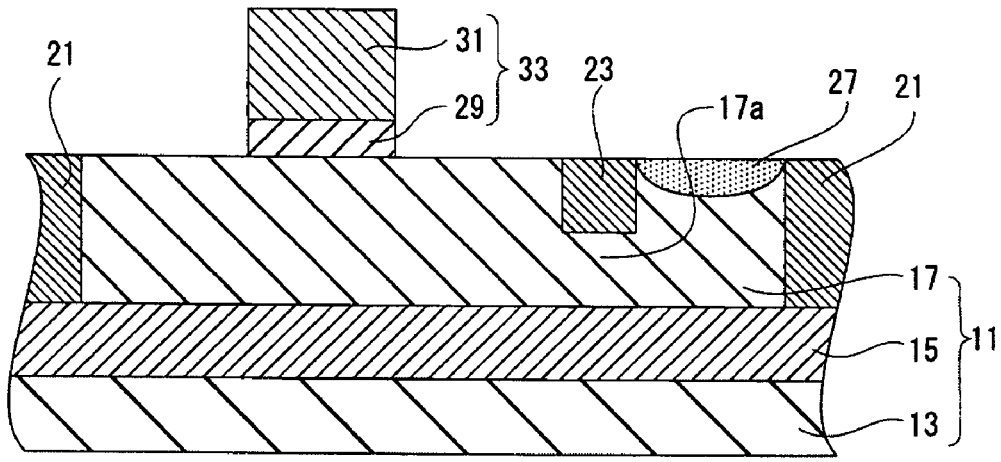
Figure 2:
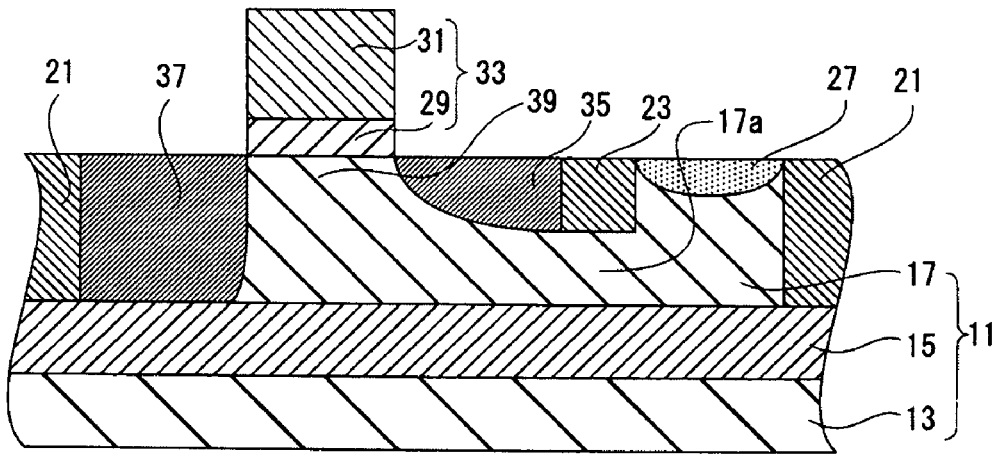
Figure 3:
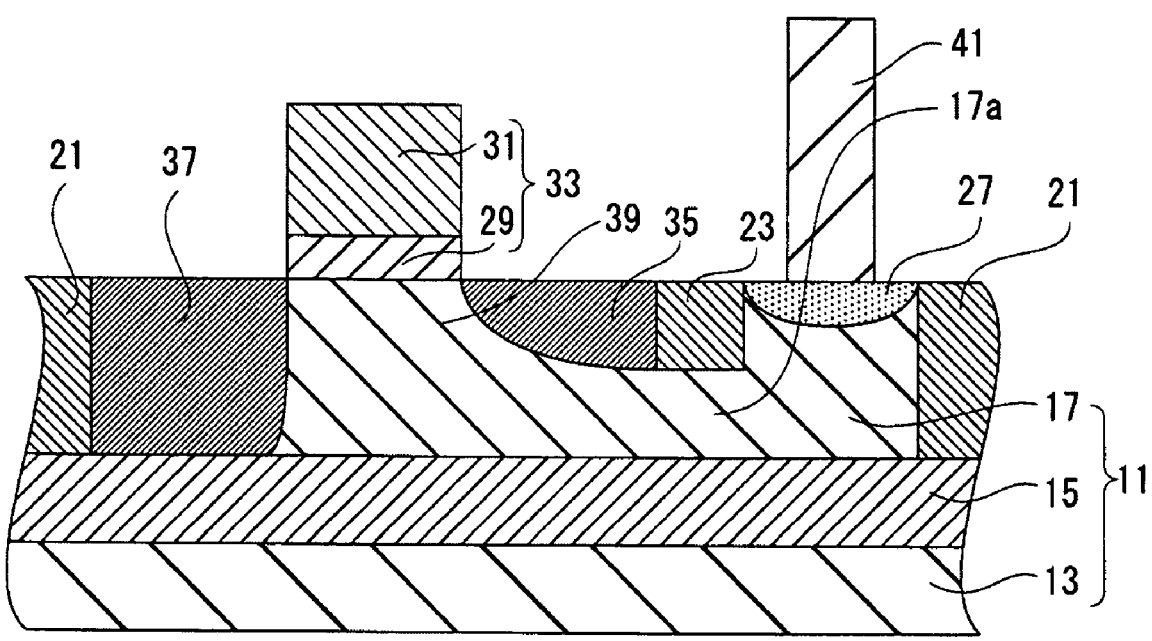
FIG. 3 is a schematic sectional view showing the process of manufacturing the semiconductor device continued from FIG. 1(C) and taken along a line 3-3 in FIG. 5 according to the embodiment of the present invention.
Figure 4:
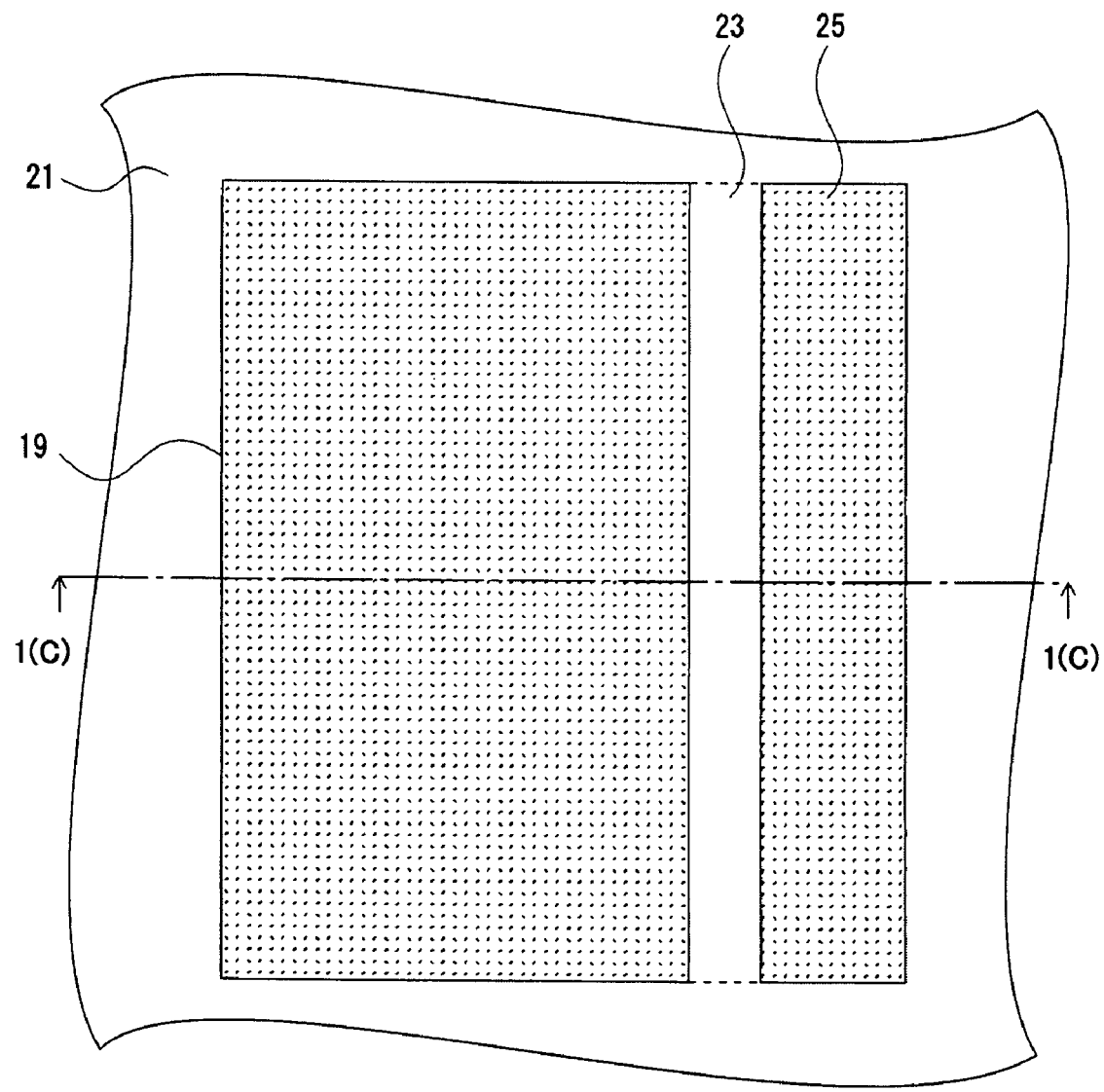
FIG. 4 is a schematic plan view showing the semiconductor device according to the embodiment of the present invention.
Figure 5:
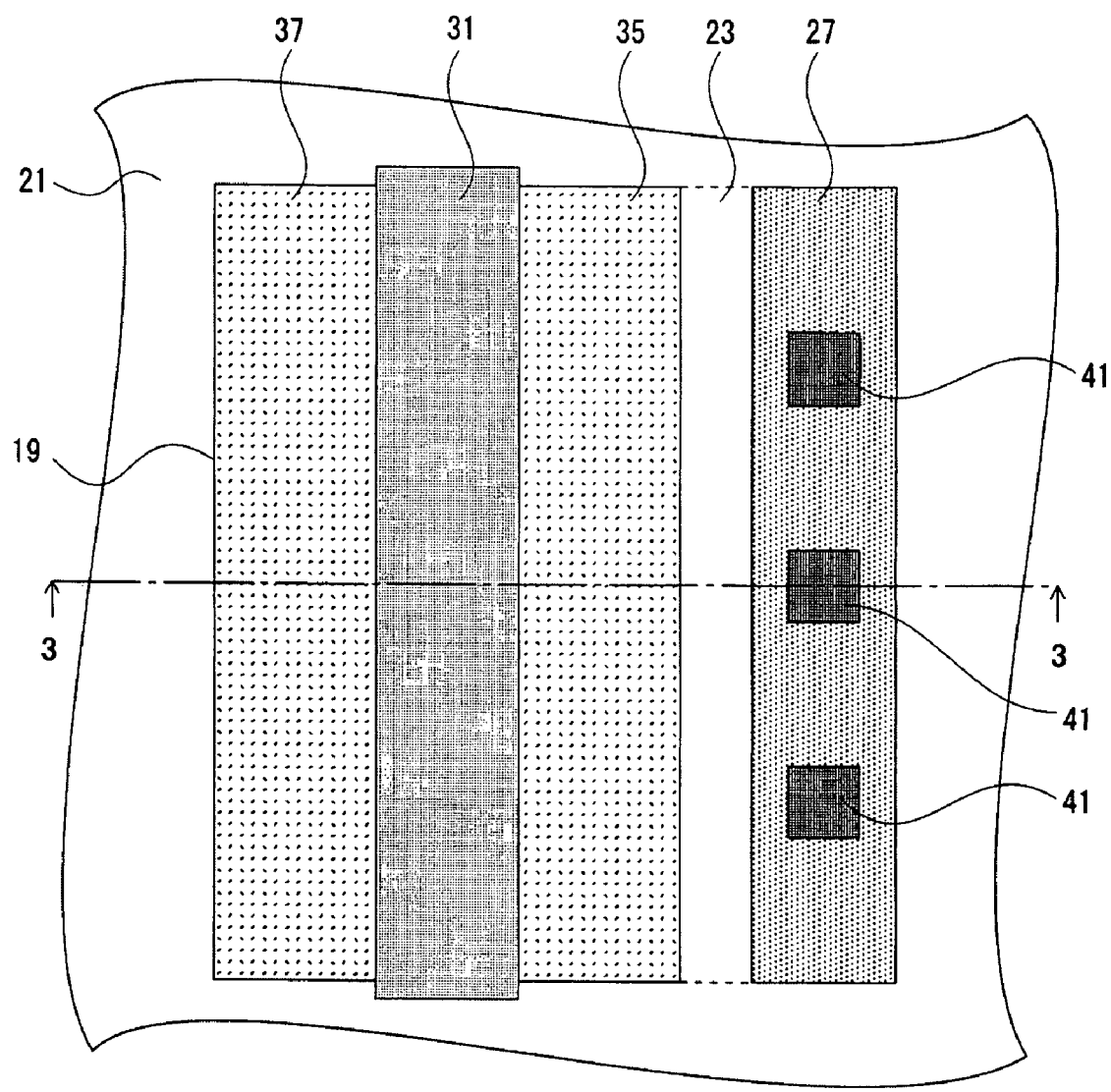
FIG. 5 is a schematic plan view showing the semiconductor device according to the embodiment of the present invention.
Figure 6:
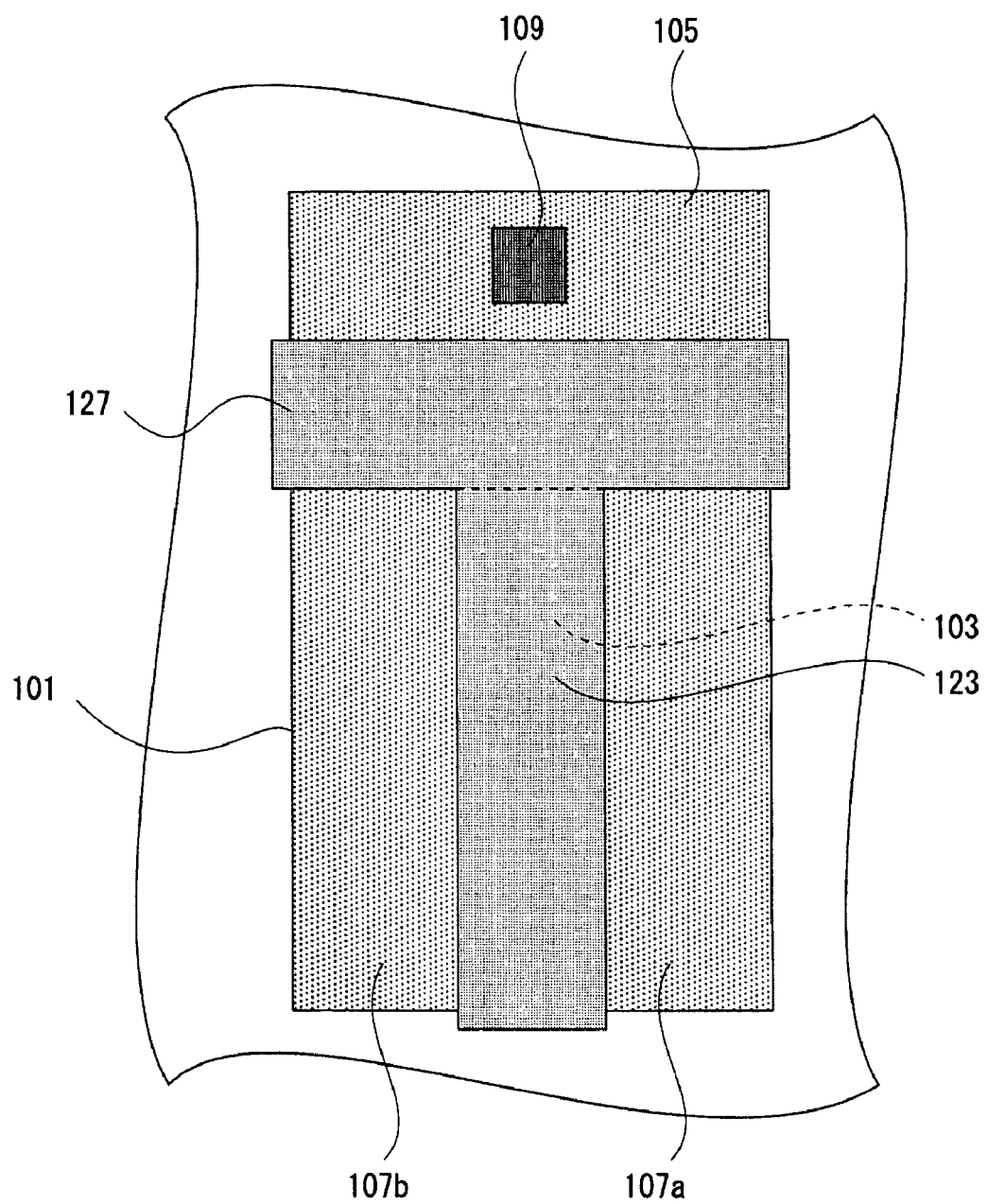
FIG. 6 is a schematic plan view showing a conventional semiconductor device.
Figure 7:
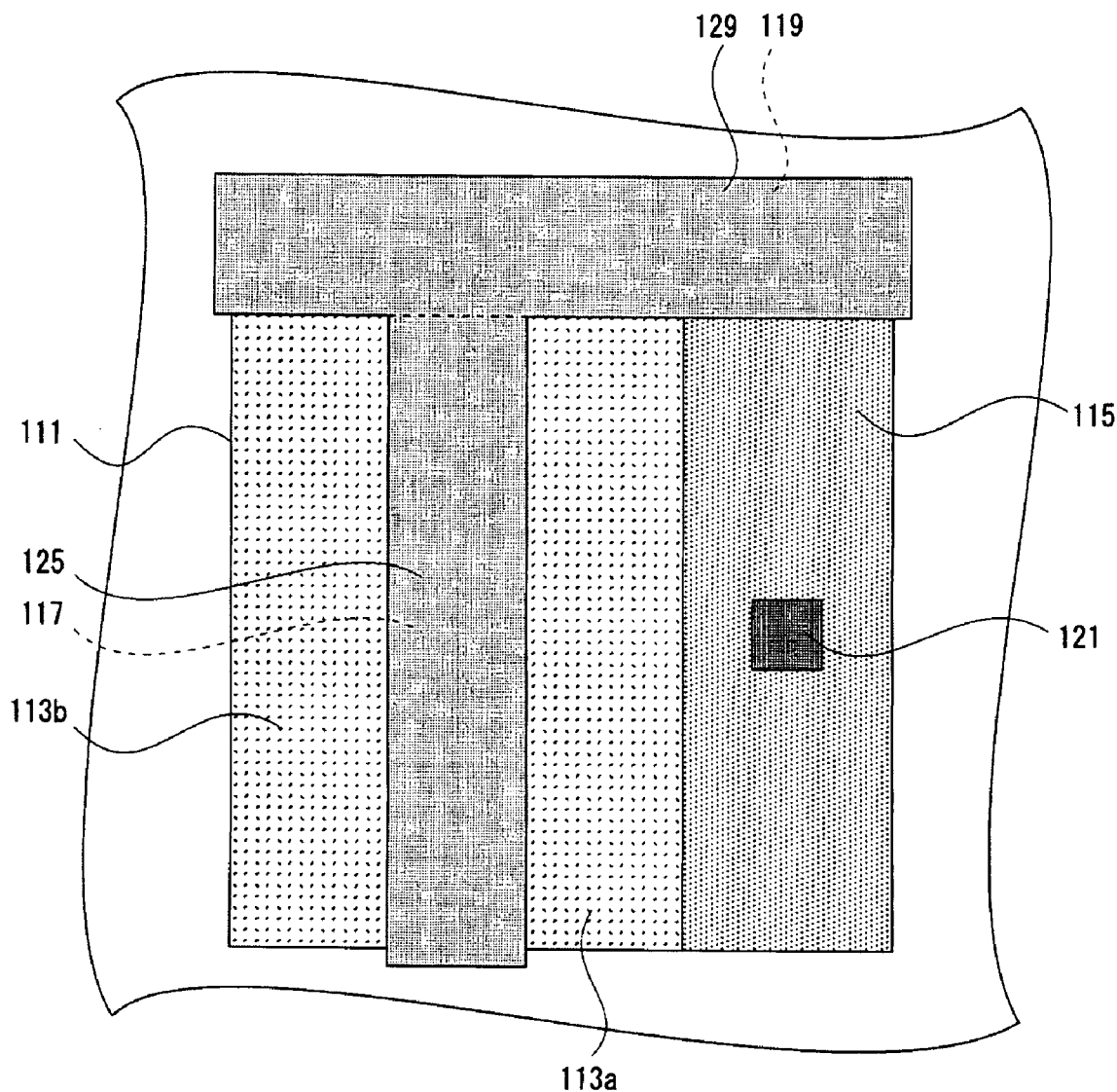
FIG. 7 is a schematic plan view showing another conventional semiconductor device.

FIGS. 1(A) to 1(C) are schematic sectional views showing a process of manufacturing a semiconductor device according to the embodiment of the present invention, wherein FIG. 1(C) is a schematic sectional view taken along a line 1(C)-1(C) in FIG. 4. FIGS. 2(A) to 2(C) are schematic sectional views showing the process of manufacturing the semiconductor device continued from FIG. 1(C) according to the embodiment of the present invention. FIG. 3 is a schematic sectional view showing the process of manufacturing the semiconductor device continued from FIG. 1(C) and taken along a line 3-3 in FIG. 5 according to the embodiment of the present invention.

In the first step, a semiconductor substrate shown in FIG. 1(A) is prepared. The semiconductor substrate has the insulation layer and the semiconductor layer formed on the upper surface of the insulation layer. A first conductive type impurity or first conductive impurity is introduced into the semiconductor layer.

In the embodiment, as the semiconductor substrate having the insulation layer and the semiconductor layer, a silicon on insulator (SOI) substrate 11 is used. The SOI substrate 11 may be referred to as the semiconductor substrate 11.

In the embodiment, the SOI substrate 11 is prepared with a well-known method. That is, oxygen ions are introduced from a surface of a single crystal silicon substrate, and then the single crystal silicon substrate is annealed at a high temperature. During the high temperature annealing, inside the single crystal silicon substrate, oxygen ions thus introduced are coupled with silicon constituting the substrate, thereby forming a silicon oxide layer functioning as an insulation layer.

Accordingly, in the SOI substrate 11, an insulation layer 15 is formed on an upper surface of a silicon substrate 13, and a silicon layer 17 is formed on an upper surface of the BOX layer 15 as the semiconductor layer. As a result, the SOI substrate 11 has a three-layered structure. The insulation layer 15 may be referred to as a BOX layer 15. Further, the silicon layer 17 formed on the upper surface of the BOX layer 15 of the SOI substrate 11 may be referred to as an SOI layer 17.

In the embodiment, the SOI layer 17 of the SOI substrate 11 preferably has a thickness in a range of 300 to 600 Å. When the SOI layer 17 has a thickness in the range of 300 to 600 Å, it is possible to make the semiconductor device thus produced a full depletion type. Accordingly, when the MOSFET thus produced is driven, the MOSFET can be operated in a full depletion mode. As a result, the semiconductor device has a full depletion property, in which it is possible to suppress a short channel effect and operate at a high speed. Note that when the SOI layer 17 has a thickness in the range of 300 to 600 Å, it is possible to make the semiconductor device the full depletion type. It is suffice that the SOI layer 17 has a thickness close to the range, and not limited thereto.

As described above, in the embodiment, the first conductive type impurity is introduced into the SOI layer 17. When the MOSFET is a p-type, the first conductive type impurity includes an n-type impurity such as arsenic (As), phosphorus (P), and the likes. When the MOSFET is an n-type, the first conductive type impurity includes a p-type impurity such as gallium (Ga), indium (In), and the likes.

In the second step, as shown in FIG. 1(B), second separation areas 21 are formed in the SOI layer 17 for defining an element area 19 such that the second separation areas 21 have a depth from a surface of the SOI layer 17 reaching the BOX layer 15. That is, the second separation areas 21 are formed with a well-known method such as a local oxidation of silicon (LOCOS) method, a shallow trench isolation (STI) method, and the likes, so that the second separation areas 21 electrically separate the element area 19 on the SOI substrate 11 each other. Further, the second separation areas 21 are formed to have a depth from an upper surface of the SOI layer 17 reaching the BOX layer 15 for securely separating the element area 19.

In the third step, as shown in FIG. 1(C), a first separation area 23 is formed in the element area 19 such that the first separation area 23 has a depth not reaching the BOX layer 15. FIG. 1(C) is a schematic sectional view taken along the line 1(C)-1(C) in FIG. 4 and viewed from an arrow direction.

In the third step, the first separation area 23 is provided for defining an intermediate high-concentration body area 25 together with one of the second separation areas 21. The intermediate high-concentration body area 25 is an area to become a high-concentration body area in the fourth step. With the first separation area 23 and the second separation areas 21 defining the intermediate high-concentration body area 25, it is possible to electrically separate the high-concentration body area from the MOSFET to be produced in a later step, thereby reducing an influence of the high-concentration body area on the transistor.

As described above, the first separation area 23 is formed in the element area 19 and has a depth not reaching the BOX layer 15. Accordingly, a portion of the element area 19, i.e., a portion 17a of the SOI layer 17, remains between the first separation area 23 and the BOX layer 15. With this structure, when hot carrier is generated in the channel area of the MOSFET, hot carrier can move to the high-concentration body area through the portion 17a of the SOI layer 17 below the first separation area 23. In order for hot carrier to move smoothly from the channel area to the hot-concentration body area, it is preferred that the first separation area 23 has a thickness about one third of that of the SOI layer 17. The thickness of the first separation area 23 is not limited to one third of that of the SOI layer 17, and may be a similar value as far as hot carrier can move smoothly from the channel area to the hot-concentration body area.

In the third step, the first separation area 23 is preferably formed with the well-known STI method. In particular, an area of the SOI layer 17 where the first separation area 23 is formed is removed with a well-known etching technology. Then, an insulation layer such as an oxide layer and the likes is filled in the area of the SOI layer 17 thus removed, thereby forming the first separation area 23. As compared with an element separation technology such as the LOCOS method, with the STI method, it is possible to easily control a thickness of the first separation area 23.

In the embodiment, with the STI method, the first separation area 23 is situated accurately away from the BOX layer 15, that is, the first separation area 23 is formed in the SOI layer 17 to have a thickness not reaching the BOX layer 15.

In the fourth step, as shown in FIG. 2(A), the first conductive type impurity is introduced into at least a surface layer of the intermediate high-concentration body area 25 to form a high-concentration body area 27. The surface layer is exposed on the intermediate high-concentration body area 25, i.e., the SOI layer 17, and is situated in the SOI layer 17 near the surface thereof. In the embodiment, the high-concentration body area 27 may be formed to have a depth reaching the BOX layer 15 according to a design of the semiconductor device.

As described above, the first conductive type impurity is introduced into the SOI layer 17 including the intermediate high-concentration body area 25. In the fourth step, first, an impurity similar to the first conductive type impurity is introduced into the intermediate high-concentration body area 25 defined with the first separation area 23 and the second separation areas 21 in the third step. When the MOSFET to be produced in a later step is a p-type (pMOS), the first conductive type impurity includes an n-type impurity such as arsenic (As), phosphorus (P), and the likes. When the MOSFET to be produced in a later step is an n-type (nMOS), the first conductive type impurity includes a p-type impurity such as gallium (Ga), indium (In), and the likes.

In the fourth step, the impurity is introduced with a well-known technology such as implantation. After introducing the impurity, the intermediate high-concentration body area 25 becomes the high-concentration body area 27 having a high purity concentration as compared with other areas of the SOI layer 17.

After the impurity is introduced, a thermal treatment is performed at about 900° C. with a well-known rapid temperature annealing (RTA) technology and the likes, so that the impurity thus introduced is activated. Through the thermal treatment, the intermediate high-concentration body area 25 is converted to the high-concentration body area 27. A temperature of the thermal treatment is not limited to 900° C., and may be any temperature as far as the impurity thus introduced is activated.

With the high-concentration body area 27 having a high impurity concentration, it is possible to reduce a contact resistance between a body contact to be formed on the high-concentration body area 27 in a later step and the SOI layer 17 with the high-concentration body area 27 formed therein. In order to reduce the contact resistance between the body contact and the SOI layer 17, it is preferred that the impurity is introduced into the intermediate high-concentration body area 25 at an impurity concentration of $1.0 \times 10^{15}/cm^2$. The impurity concentration is not limited to $1.0 \times 10^{15}/cm^2$, and may be any value as far as the same effect is obtained.

In the fifth step, as shown in FIG. 2(B), a gate electrode portion 33 is formed in the element area 19 at a position thereof opposite to the high-concentration body area 27 with respect to the first separation area 23. The gate electrode portion 33 includes a gate oxide layer 29 and a gate electrode 31.

In the fifth step, the gate oxide layer 29 and the gate electrode 31 are formed with a well-known method. That is, the gate oxide layer 29 may be formed through thermal oxidation on the element area 19. Then, a poly-silicon layer is formed on the gate oxide layer 29 with a CVD method and the likes to form the gate electrode 31. Afterward, the gate oxide layer 29 and the gate electrode 31 are patterned with a well-known photolithography technology, a well-known dry etching technology, and the likes, thereby forming the gate electrode portion 33.

In the sixth step, as shown in FIG. 2(C), a second conductive type impurity or second conductive impurity is introduced into intermediate channel areas of the element area 19 at both sides in a channel length direction to form a source area 35 and a drain area 37. At the same time, a channel area 39 is formed between the source area 35 and the drain area 37.

In particular, the second conductive impurity is introduced into a first area among the channel areas at both sides of the gate electrode portion 33 between the first separation area and the intermediate channel area to form the source area 35. Further, the second conductive impurity is introduced into a second area among the channel areas at both sides of the gate electrode portion 33 opposite to the first area to form the drain area 37.

In the embodiment, the second conductive impurity has a polarity opposite to that of the first conductive impurity. When the MOSFET is a p-type, the second conductive type impurity includes a p-type impurity such as gallium (Ga), indium (In), and the likes. When the MOSFET is an n-type, the second conductive type impurity includes an n-type impurity such as arsenic (As), phosphorus (P), and the likes.

In the embodiment, the second conductive impurity is introduced with a well-known method such as source/drain (S/D) implantation and the likes. The source area 35 has a depth not reaching the BOX layer 15. That is, the source area 35 is formed in the element area 19 up to a middle position from the surface of the element area 19 away from the BOX layer 15. Further, the drain area 37 has a depth reaching the BOX layer 15. Accordingly, in the sixth step, the source area 35 and the drain area 37 are formed separately.

In particular, a mask (not shown) is formed on the upper surface of the element area 19 in the first area where the source area 35 is to be formed except an area between the first separation area 23 and the intermediate channel area with the well-known photolithography technology. Afterward, the second conductive impurity is introduced using the mask with the well-known S/D implantation and the likes, thereby forming the source area 35. At this moment, the source area 35 has a depth not reaching the BOX layer 15. That is, the second conductive impurity is introduced into a depth not reaching the BOX layer 15 while regulating introduction energy. It is preferred that the source area 35 is situated away from the upper surface of the BOX layer 15 by a distance of at least 250 Å. After the source area 35 is formed, the mask is removed.

In the next step, the drain area 37 is formed with a method similar to that of the source area 35. That is, a mask (not shown) is formed on the upper surface of the element area 19 in the second area where the drain area 37 is to be formed except the area opposite to the area where the source area 35 is to be formed with the well-known photolithography technology. Afterward, the second conductive impurity is introduced using the mask with the well-known S/D implantation and the likes, thereby forming the drain area 37. At this moment, the drain area 37 has a depth reaching the BOX layer 15. That is, the second conductive impurity is introduced into a depth reaching the BOX layer 15. After the drain area 37 is formed, the mask is removed.

As described above, the source area 35 and the drain area 37 are formed separately in the different steps. Accordingly, it is possible to form the source area 35 having the depth not reaching the BOX layer 15 and the drain area 37 having the depth reaching the BOX layer 15, respectively. In the embodiment, the source area 35 is formed first, and then the drain area 37 is formed. Alternatively, the drain area 37 may be formed first, and then the source area 35 is formed.

In the embodiment, when the source area 35 and the drain area 37 are formed, the second conductive impurity is not introduced into a lower area of the gate electrode portion 33, i.e., the intermediate channel area, so that the lower area remains as an area where the first conductive impurity is introduced. The area where the first conductive impurity is introduced, i.e., the intermediate channel area, becomes a channel area 39.

When the channel area 39 is formed, the first separation area 23 is situated adjacent to a side of the source area 35 opposite to the channel area 39. Accordingly, the channel area 39, the source area 35, the drain area 37, and the gate electrode portion 33 formed in the fifth step constitute the MOSFET.

As explained above, in the embodiment, the source area 35 constituting the MOSFET is formed between the channel area 39 and the first separation area 23, and has a depth not reaching the BOX layer 15. Further, the first separation area 23 has a depth not reaching the BOX layer 15. Accordingly, the channel area 39 is connected to the high-concentration body area 27 defined by the first separation area 23 and the second separation areas 21 through the portion of the SOI layer 17 below the source area 35 and the first separation area 23, i.e., the lower portions of the source area 35 and the first separation area 23.

Further, the first conductive impurity is introduced into the lower portions of the source area 35 and the first separation area 23, the channel area 39, and the high-concentration body area 27. Accordingly, when the MOSFET is driven, hot carrier generated in the channel area 39 can move to the high-concentration body area 27 through the lower portions of the source area 35 and the first separation area 23. It is preferred that the source area 35 has a depth away from the upper surface of the BOX layer 15 by at least 250 Å.

In the embodiment, in the SOI layer 17, the source area 35 is away from the BOX layer 15 by a specific distance. Accordingly, it is possible to securely move hot carrier from the channel area 39 to the high-concentration body area 27. Note that the specific distance is at least 250 Å in the embodiment, and not limited thereto and may be any similar distance as far as the effect, with which it is possible to securely move hot carrier from the channel area 39 to the high-concentration body area 27, can be obtained.

In the seventh step, a body contact 41 is formed on the high-concentration body area 27, thereby obtaining the structure shown in FIG. 3. FIG. 3 is a schematic sectional view taken along a line 3-3 in FIG. 5 and viewed from an arrow direction. The body contact 41 is provided for applying potential to the high-concentration body area 27 connected to the channel area 39, so that hot carrier generated in the channel area 39 is pulled out.

In the embodiment, the body contact 41 is formed with a well-known method such as a CVD method and the likes using a material such as tungsten, poly-silicon containing impurity, and the likes. The body contact 41 may be formed at a plurality of locations according to an area of the element area 19. For example, the body contacts 41 are disposed at three locations in the configuration shown in FIG. 5.

As described above, in the semiconductor device in the embodiment, the source area 35 is formed in the SOI layer 17 and has a depth not reaching the BOX layer 15. Further, the first separation area 23 is formed on the side of the source area 35 opposite to the channel area 39, and has a depth not reaching the BOX layer 15. Accordingly, since the source area 35 and the first separation area 23 have depths not reaching the BOX layer 15, the channel area 39 is connected to the high-concentration body area 27 through the lower portions of the source area 35 and the first separation area 23 in the SOI layer 17.

Accordingly, in the semiconductor device in the embodiment, hot carrier generated in the channel area 39 can move to the high-concentration body area 27 through the lower portions of the source area 35 and the first separation area 23 in the SOI layer 17, i.e., the portions between the first separation area 23 and the source area 35, and the BOX layer 15. When a potential is applied to the high-concentration body area 27 through the body contact 41, hot carrier generated in the channel area 39 moves to the high-concentration body area 27 through the lower portions of the source area 35 and the first separation area 23 in the SOI layer 17. After moving to the high-concentration body area 27, hot carrier is pulled out through the body contact 41 formed on the upper-surface of the high-concentration body area 27.

Further, the high-concentration body area 27 is electrically separated with the first separation area 23 from the area where the MOSFET is formed. Accordingly, in the semiconductor device in the embodiment, it is not necessary to provide a gate electrode portion for separation, thereby reducing an influence of the high-concentration body area 27 on the MOSFET.

As compared with a conventional structure such as a body-tie structure and a source-tie structure, in the semiconductor device in the embodiment, it is not necessary to provide a hot carrier moving area. Further, other than the gate electrode portion 33, it is not necessary to provide an additional gate electrode portion for separation. Accordingly, it is possible to reduce the area of the element area 19, thereby preventing an increase in a gate resistance and deterioration of a shielding frequency caused by an increase in a gate area.

In Patent Reference, the first and second main electrode areas have depths not reaching a BOX layer. On the other hand, in the semiconductor device in the embodiment, the drain area 37 is formed in the SOI layer 17 and has a depth reaching the BOX layer 15. Accordingly, a contact area between the drain area 37 and the channel area 39 is small. As a result, as compared with the semiconductor device disclosed in Patent Reference, when the MOSFET is driven, a contact capacity between the channel area 39 and the drain area 37 decreases, thereby making the MOSFET suitable for a high-speed operation.

In the semiconductor device in the embodiment, the drain area 37 is formed in the SOI layer 17 and has a depth reaching the BOX layer 15. Accordingly, there is no portion of the SOI layer 17 below the drain area 37. As a result, as compared with the semiconductor device disclosed in Patent Reference, when the MOSFET is driven, a depletion layer does not expand in the SOI layer 17 below the drain area 37, thereby preventing a short channel effect.

In Patent Reference, a separation area is formed with the LOCOS method. In the method of producing the semiconductor device in the embodiment, in the third step, the first separation area 23 is formed with the well-known STI method. In the STI method, as compared with the LOCOS method, it is possible to easily control the thickness of the first separation area 23. Accordingly, as compared with the method disclosed in Patent Reference, it is possible to securely form the first separation area 23 away from the BOX layer 15.

Accordingly, in the semiconductor device in the embodiment, it is possible to form the first separation area 23 in the SOI layer 17 away from the BOX layer 15, so that hot carrier can move. That is, it is possible to prevent problems, in which it is difficult to obtain a sufficient distance between the high-concentration body area 27 and the BOX layer 15, or the first separation area 23 contacts with the BOX layer 15.

Even when the SOI layer 17 formed on the SOI substrate has a small thickness, it is possible to form the first separation area 23 while accurately adjusting a distance between the first separation area 23 and the BOX layer 15. Accordingly, it is possible to effectively move hot carrier generated in the channel area 39 to the high-concentration body area 27 through the lower portion of the first separation area 23. Then, hot carrier is securely pulled out through the body contact 41.

In the semiconductor device in the embodiment, the SOI substrate 11 is used as the semiconductor substrate, and is not limited thereto. The present invention is applicable to other semiconductor substrates such as an SOS substrate as far as a semiconductor has an insulation layer and a silicon layer formed on the insulation layer.

The disclosure of Japanese Patent Application No. 2006-249669, filed on Sep. 14, 2006, is incorporated in the application.

While the invention has been explained with reference to the specific embodiments of the invention, the explanation is illustrative and the invention is limited only by the appended claims.

What is claimed is:

1. A method of producing a semiconductor device, comprising the steps of:
   preparing a semiconductor substrate having an insulation layer and a semiconductor layer formed on the insulation layer;
   forming a second separation area having a depth reaching the insulation layer in the semiconductor layer to define and surround an element area;
   forming a first separation area having a depth not reaching the insulation layer in the semiconductor layer with a shallow trench isolation method;
   forming an intermediate high-concentration body area between the first separation area and the second separation area;
   introducing a first conductive impurity into at least a surface layer of the intermediate high-concentration body area to convert the intermediate high-concentration body area to a high concentration body area;
   forming a gate electrode in the element area at a side of the first separation area opposite to the high-concentration body area;
   introducing a second conductive impurity having polarity opposite to that of the first conductive impurity into a first area and a second area at both sides of the gate electrode to form a source area having a depth not reaching the insulation layer and a drain area having a depth reaching the insulation layer so that a channel area is formed below the gate electrode between the source area and the drain area; and
   forming a body contact on the high-concentration body area.

2. The method of producing a semiconductor device according to claim 1, wherein, in the step of forming the first separation area, said first separation area is formed to have a thickness substantially equal to one third of that of the semiconductor layer.

3. The method of producing a semiconductor device according to claim 1, wherein, in the step of preparing the semiconductor substrate, said semiconductor substrate is prepared so that the semiconductor layer has a thickness in a range of 300 Å to 600 Å.

4. The method of producing a semiconductor device according to claim 1, wherein, in the step of introducing the second conductive impurity, said second conductive impurity is introduced so that the source area is disposed away from the insulation layer by at least 250 Å.

5. A semiconductor device comprising:
   a semiconductor substrate having an insulation layer and a semiconductor layer formed on the insulation layer;
   a channel portion connected to the semiconductor layer;
   a gate electrode disposed on the channel portion;
   a source portion disposed adjacent to the channel portion and on the semiconductor layer so that the semiconductor layer is situated between the source portion and the insulation layer;
   a drain portion disposed adjacent to the channel portion opposite to the source portion and contacting with the insulation layer;
   a first separation portion disposed adjacent to the source portion opposite to the channel portion and on the semiconductor layer so that the semiconductor layer is situated between the separation portion and the insulation layer, said first separation portion being formed with a shallow trench isolation (STI) method;
   a second separation portion disposed on the insulation layer and surrounding the semiconductor layer;
   a high-concentration body portion disposed between the first separate portion and the second separation portion; and
   a body contact disposed on the high-concentration body portion.

6. A semiconductor device comprising:
   a semiconductor substrate having an insulation layer and a semiconductor layer formed on the insulation layer;
   an element area formed in the semiconductor layer;
   a second separation area formed in the semiconductor layer for surrounding and separating the element area, said second separation area having a depth reaching the insulation layer;
   a channel area formed in the semiconductor layer;
   a gate electrode formed on the channel area;
   a source area formed in the semiconductor layer and having a depth not reaching the insulation layer;
   a drain area formed in the semiconductor layer adjacent to the source area with the channel area inbetween, said drain area having a depth reaching the insulation layer;
   a first separation area disposed next to the source area opposite to the channel area, said first separation area having a depth not reaching the insulation layer, said first separation area being formed with a shallow trench isolation (STI) method;

a high-concentration body area formed in the semiconductor layer at least in a surface layer thereof and between the first separation area and the second separation area; and a body contact disposed on the high-concentration body area.

7. The semiconductor device according to claim 6, wherein said semiconductor layer and channel area contains a first conductive impurity at a first concentration.

8. The semiconductor device according to claim 7, wherein said high-concentration body area contains the first conductive impurity at a second concentration greater than the first concentration.

9. The semiconductor device according to claim 6, wherein said semiconductor layer has a first thickness, said first separation area having a second thickness substantially equal to one third of the first thickness.

10. The semiconductor device according to claim 6, wherein said semiconductor layer has a thickness in a range of 300 Å to 600 Å.

11. The semiconductor device according to claim 6, wherein said source area is disposed away from the insulation layer by at least 250 Å.

12. The semiconductor device according to claim 6, wherein said high-concentration body area is formed in a whole area of the semiconductor layer between the first separation area and the second separation area.

13. The semiconductor device according to claim 6, wherein said high-concentration body area is arranged to contact with both the first separation area and the second separation area.

* * * * *